(12) United States Patent
Chen et al.

(10) Patent No.: US 7,388,267 B1
(45) Date of Patent: Jun. 17, 2008

(54) SELECTIVE STRESS ENGINEERING FOR SRAM STABILITY IMPROVEMENT

(75) Inventors: Xiangdong Chen, Poughquag, NY (US); Young G. Ko, Fishkill, NY (US); Haining Yang, Wappingers Falls, NY (US)

(73) Assignees: International Business Machines Corporation, Armonk, NY (US); Samsung Electronics Co., Ltd. (KR)

( * ) Notice: Subject to any disclaimer, the term of this patent is extended or adjusted under 35 U.S.C. 154(b) by 0 days.

(21) Appl. No.: 11/612,643

(22) Filed: Dec. 19, 2006

(51) Int. Cl.
*H01L 29/78* (2006.01)
(52) U.S. Cl. .................. 257/418; 257/190; 257/903; 257/E29.193
(58) Field of Classification Search .............. None
See application file for complete search history.

(56) References Cited

U.S. PATENT DOCUMENTS 6,984,564 B1 * 1/2006 Huang et al. ............... 438/275

7,060,549 B1    6/2006 Craig et al.

* cited by examiner

*Primary Examiner*—A. Sefer
*Assistant Examiner*—Scott R Wilson
(74) *Attorney, Agent, or Firm*—Scully, Scott, Murphy & Presser, P.c.; Yuanmin Cai, Esq.

(57) ABSTRACT

An integrated circuit (IC) structure including a SRAM cell is provided in which the performance of the pass-gate transistors is degraded in order to increase the beta ratio of the transistors within the SRAM cell. In particular, the increased beta ratio is obtained in the present invention by intentionally improving only the performance of the pull-down transistors, while degrading the performance of the pass-gate transistors. This result is achieved in the present invention by implementing stress memorization technique on logic complementary metal oxide semiconductor (CMOS) nFETs and SRAM pull-down transistors to improve the nFET performance. The stress memorization technique is not performed at the pFET region to avoid performance degradation as well as at the SRAM pass-gate transistors to avoid the improvement. With performance improvement at the pull-down transistors and no performance improvement at the pass-gate transistors, the beta ratio of the SRAM transistors is improved.

5 Claims, 2 Drawing Sheets

SELECTIVE STRESS ENGINEERING FOR SRAM STABILITY IMPROVEMENT

FIELD OF THE INVENTION

The present invention relates to an integrated circuit (IC) and more particularly, to an IC including a static random access memory (SRAM) having improved stability.

BACKGROUND OF THE INVENTION

The shrinking of metal oxide semiconductor field effect transistor (MOSFET) dimensions for high density, low power and enhanced performance requires reduced power supply voltages. As a result, dielectric thickness and channel length of the transistors are scaled with power supply voltage.

A static random access memory (SRAM) is a significant memory device due to its high speed, low power consumption, and simple operation. Unlike a dynamic random access memory (DRAM) cell, the SRAM does not need to regularly refresh the stored data and it has a straightforward design. However, SRAM stability is severely impacted by scaling. Small mismatches in the devices during processing can cause the cell to favor one of the states, either a '1' or a '0'. Mismatches can result from dislocations between the drain and the source or from dopant implantation or thermal anneal temperature fluctuation.

The SRAM cell stability determines the soft-error and the sensitivity of the memory cell to variations in process and operating conditions. One important parameter for the stability is called "beta ratio", which is the ratio between pull-down transistor drive current and pass-gate transistor drive current. In other terms, "beta ratio" can be defined as the ion ratio between the pass-gate transistor and pull-down transistor of a SRAM cell. A high beta ratio on the order of about 1.0 or greater is helpful in improving the stability of the SRAM cell.

Conventional methods to adjust the beta ratio include threshold voltage Vt implantation and active area sizing. The latter of which is limited by groundrules and mask sets.

Stress engineering has been used to improve device performance of FET devices. Usually, tensile strain is employed for n-type FETs and compressive stress is employed for p-type FETs to improve device performance. Such stress engineering is typically applied to both the pull-down transistors and the pass-gate transistors. In such prior art structures, improved device performance of both the pull-down and pass-gate transistors can be obtained, however, the beta ratio is not improved.

In view of the above, there is a need for obtaining SRAM cells wherein the beta ratio between the pull-down and pass-gate transistors is significantly improved thereby improving the overall stability of the structure.

SUMMARY OF THE INVENTION

The present invention provides an IC including a SRAM cell wherein the beta ratio between the pull-down and pass-gate transistors is significantly improved. As a result of the improvement in the beta ratio between the transistors, the overall stability of the inventive IC is significantly improved compared to that of a conventional SRAM cell.

In the present invention, the applicants provide an IC including a SRAM cell wherein the performance of the pass-gate transistors is degraded in order to increase the beta ratio of the transistors within the SRAM cell. In particular, the increased beta ratio is obtained in the present invention by intentionally improving only the performance of the pull-down transistors, while degrading the performance of the pass-gate transistors.

This desired result is achieved in the present invention by implementing a selective stress memorization technique on logic complementary metal oxide semiconductor (CMOS) nFETs and SRAM pull-down transistors to improve the performance of the aforementioned transistors. The selective stress memorization technique is not performed at the pFET region to avoid performance degradation as well as at the SRAM pass-gate transistors to avoid the improvement. With performance improvement at the pull-down transistors and no performance improvement at the pass-gate transistors, the beta ratio of the SRAM transistors is improved.

In general terms, the inventive integrated circuit (IC) includes at least one static random access memory cell including at least one pass-gate transistor and at least one pull-down transistor, wherein each pass-gate transistor has an unstressed channel and each pull-down transistors has a stressed channel.

This configuration described above provides a SRAM wherein the ion ratio between the at least one pass-gate transistor and the at least one pull-down transistor is about 1.0 or greater. This represents a significant improvement over prior SRAMs in which each of the transistors includes a stressed channel, or wherein each of the transistors includes an unstressed channel.

The semiconductor IC of the present invention also contains a logic area adjacent to the area including the at least one static random access memory cell. In the present invention, the logic area includes at least one nFET having a stressed channel and at least one pFET having an unstressed channel.

The present invention also provides a method of fabricating such an IC in which a selective stress memorization process is used to introduce stress into the channels of each pull-down transistors of the SRAM cells. The inventive selective stress memorization process also introduces stress into the channels of the logic nFET devices.

DETAILED DESCRIPTION OF THE INVENTION

Figure 1A:
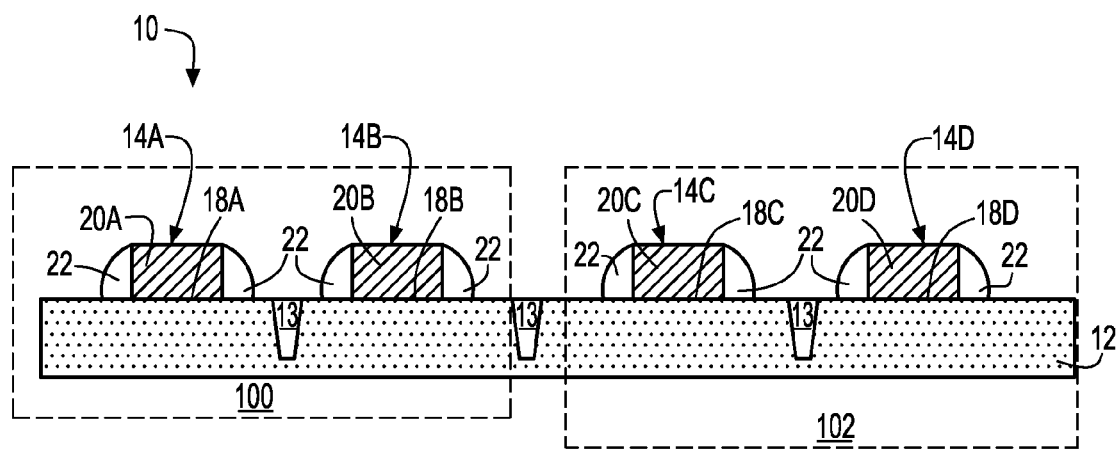
FIGS. 1A-1E are pictorial representations (through cross sectional views) depicting the basic processing steps of the present invention used for increasing the beta ratio of SRAM transistors.

The present invention, which provides a selective stress engineering technique to increase the stability of a SRAM cell as well as the resultant IC that is fabricated utilizing the same, will now be described in greater detail by referring to the following discussion and drawings that accompany the present application. The drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides an IC including a SRAM cell wherein the beta ratio (i.e., ion ratio) between the pull-down and pass-gate transistors is significantly improved. As a result of the improvement in the beta ratio between the transistors, the overall stability of the SRAM cell of the inventive IC is significantly improved compared to that of a conventional SRAM cell.

In the present invention, an IC including a SRAM cell is provided in which the performance of the pass-gate transistors is degraded in order to increase the beta ratio of the transistors within the SRAM cell. In particular, the increased beta ratio is obtained in the present invention by intentionally improving only the performance of the pull-down transistors, while degrading the performance of the pass-gate transistors.

This desired result is achieved in the present invention by implementing a selective stress memorization technique on logic complementary metal oxide semiconductor (CMOS) nFETs and SRAM pull-down transistors to improve the performance of the aforementioned transistors. The stress memorization technique is not performed at the pFET region to avoid performance degradation as well as at the SRAM pass-gate transistors to avoid the improvement. With performance improvement at the pull-down transistors and no performance improvement at the pass-gate transistors, the beta ratio of the SRAM transistors is improved.

The selective stress memorization technique employed in the present invention will now be described in greater detail by referring to FIGS. 1A-1E. Specifically, FIG. 1A illustrates an initial IC 10 that can be employed in the present invention. As shown, the IC 10 includes a semiconductor substrate 12 having trench isolation regions 13 therein. The semiconductor substrate 12 includes at least one logic device region or area 100 and at least one SRAM device region or area 102. Although such regions are shown, the present invention works equally well with other types of device regions.

Each of the various device regions (i.e., regions 100 and 102) includes transistors 14A, 14B, 14C and 14D. In the embodiment illustrated, the transistor 14A represents an nFET, the transistor 14B represents a pFET, the transition 14C represents a pass-gate transistor and transistor 14D represents a pull-down transistors. Although the drawings depict the presence of one of each of the aforementioned types of transistors, a plurality of such transistors can be located on the surface of the semiconductor substrate 12.

It is noted that in the SRAM device region 102, at least one SRAM cell is present that typically includes six transistors, two pass-gate, two pull-down and two pull-up. The SRAM cell layout that is employed in the present invention includes any conventional layout including, for example, the SRAM layout shown in FIG. 4 of U.S. Pat. No. 6,984,564.

Each transistor shown includes a gate stack that comprises at least a gate dielectric 18A, 18B, 18C, and 18D, and a gate conductor 20A, 20B, 20C and 20D. Also present on the sidewalls of each of the gate stacks is a dielectric spacer 22.

The various elements/components shown in FIG. 1A are comprised of materials that are well known to those skilled in the art. For example, the semiconductor substrate 12 includes any semiconductor material including, for example, Si, SiGe, SiGeC, SiC, Ge alloys, GaAs, InAs, InP and other III/V or II/VI compound semiconductors. The semiconductor substrate 12 may be a bulk substrate, a layered substrate (such as Si/SiGe or a semiconductor-on-insulator (SOI)) or a hybrid substrate that has surface regions of different crystallographic orientation. A preferred semiconductor material for substrate 12 is a Si-containing semiconductor.

The substrate 12 may be strained, unstrained or contain regions of strain and unstrain therein. The substrate 12 may also be undoped, doped or contain doped regions and undoped regions.

The trench isolation regions 13 are typically comprised of a trench dielectric material such as a trench oxide and are formed utilizing a conventional trench isolation process. The trench isolation region 13 can be replaced with field oxide isolation regions or any other type of isolation region used in the art for separating devices from each other.

The transistors can be formed by deposition, lithography, etching or a replacement gate process can be used. The gate dielectric of each transistor may be the same or different insulating material including, for example, oxides, nitrides, oxynitrides and multilayer stacks of any of these insulators. Preferably, an oxide such as, but not limited to, silicon dioxide, is used as the gate dielectric. The gate conductor of each transistor comprises any conductive material including doped polySi, doped SiGe, an elemental metal, an alloy of an elemental metal, a metal silicide or any multilayered stack thereof (e.g., a stack of a metal silicide located atop a polySi base). Preferably, polySi gate conductors are employed. The dielectric spacer of each transistor includes an oxide, nitride, oxynitride and multilayers stacks thereof. Preferably, the spacer is an oxide or nitride of silicon.

It will be appreciated by one skilled in the art that during the manufacturing of each transistor dopants can be introduced into the substrate to form source/drain extension regions, halo implant regions, and source/drain diffusion regions within the substrate at the footprint of each of the transistors. Conventional ion implantations processes can be used in forming any of the above-mentioned regions.

As one skilled in the art is also aware the region of the substrate 12 beneath the gate stack of each transistor is the channel of each device. The channel region is typically laterally confined by the implant regions formed above.

Figure 1B:
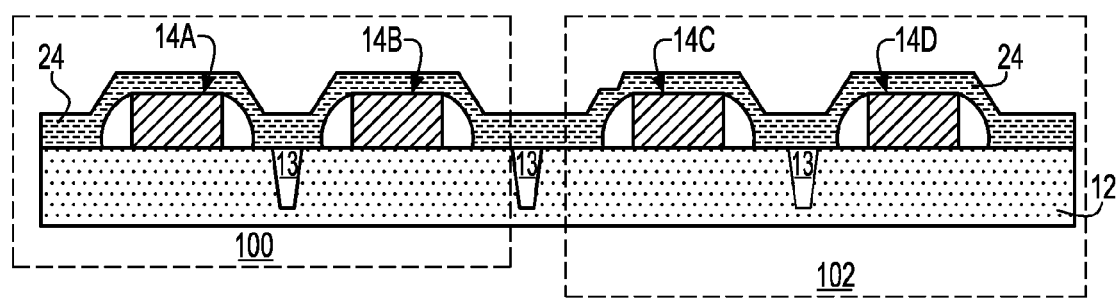

FIG. 1B illustrates the IC structure that is formed after forming a liner 24 on all the exposed surfaces of the structure shown in FIG. 1A. The liner 24 is typically a tensile stressed material. The liner 24 may comprise an insulating material such as silicon nitride, a conductive material and/or a semiconductive material. Preferably, silicon nitride is used as the liner 24.

The liner 24 is formed utilizing any conventional deposition process including, for example, a low pressure chemical vapor deposition (LPCVD) process or a PECVD process. The thickness of the liner 24 may vary and it is not critical to the practice of the present invention.

Figure 1C:
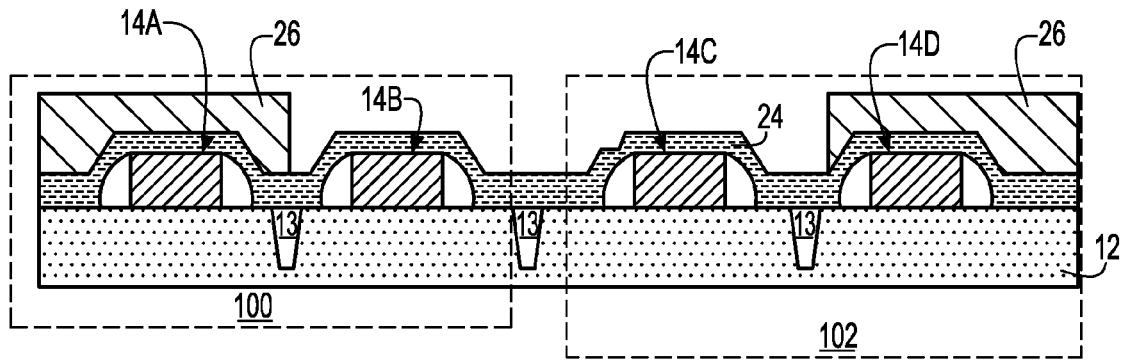

FIG. 1C shows the structure after a block mask 26 is formed over the nFET 14A and the pull-down transistor 14D; the other transistors, i.e., the pFET 14B and the pass-gate transistor 14C are not protected by the block mask 26. The block mask 26 comprises a hard mask material such as an oxide and/or photoresist. Typically, a photoresist is used as the block mask 26. The block mask 26 is formed utilizing a conventional process including deposition of the mask material, lithography and optionally etching (typically used when the block mask is comprised of a hard mask material).

Figure 1D:
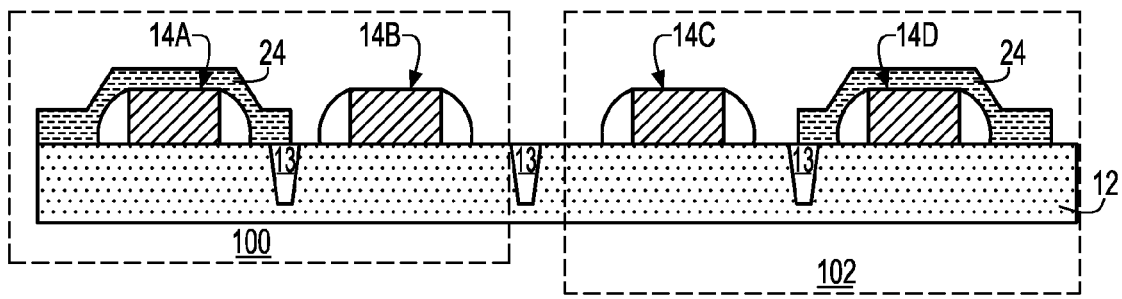

FIG. 1D illustrates the IC that is formed after selectively removing the exposed portions of the liner 24 that are not protected by a block mask 26. The selective removal is performed utilizing a dry etching process such as reactive ion etching (RIE) or a wet chemical etching process can be used. After etching, the block mask 26 is stripped utilizing a conventional stripping process well known to those skilled in the art.

It is noted that at this point of the present invention the liner 24 is located around the nFET 14A in the logic device area 100 and the pull-down transistor 14D in the SRAM area 102.

An annealing step is now performed which typically activates the dopants previously implanted into the semiconductor substrate 12. During this annealing step, the strain in the liner 24 is transferred to the channel of the nFET 14A and the pull-down transistor 14D. The annealing which is used in activating the dopants and transferring the stress from the liner 24 into the device channels is performed at a temperature of about 1000° C. or greater. An inert gas such as He, Ne, Ar, $N_2$ or mixtures thereof can be used during the annealing step. A forming gas anneal can also be used. The duration of the anneal will depend on the type of anneal process used. Longer annealing times are required when a furnace anneal is used, while shorter anneal times are used when a rapid thermal anneal, spike anneal, laser anneal or microwave anneal are used.

Figure 1E:
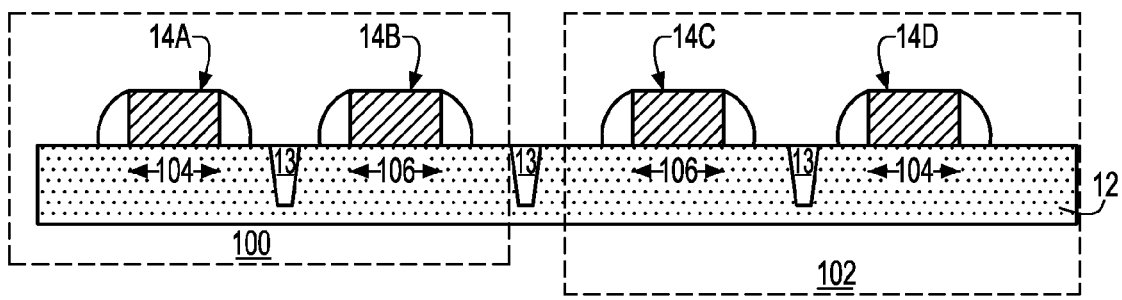

In FIG. 1E, the stressed channels are labeled as 104, while the unstressed channels are labeled as 106. FIG. 1E also shows the structure after removing the remaining liner 24 that has not previously been removed. The remaining liner 24 is removed utilizing an etching process as described above.

Conventional processing which is well known in the art may now be employed to the structure shown in FIG. 1E.

It is again emphasized that an integrated circuit (IC) structure including a SRAM cell is provided in which the performance of the pass-gate transistors is degraded in order to increase the beta ratio of the transistors within the SRAM cell. In particular, the increased beta ratio is obtained in the present invention by intentionally improving only the performance of the pull-down transistors, while degrading the performance of the pass-gate transistors. This result is achieved in the present invention by implementing stress memorization technique on logic complementary metal oxide semiconductor (CMOS) nFETs and SRAM pull-down transistors to improve the nFET performance. The stress memorization technique is not performed at the pFET region to avoid performance degradation as well as at the SRAM pass-gate transistors to avoid the improvement. With performance improvement at the pull-down transistors and no performance improvement at the pass-gate transistors, the beta ratio of the SRAM transistors is improved.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. An integrated circuit comprising:
    at least one static random access memory cell including at least one pass-gate transistor and at least one pull-down transistor, wherein each pass-gate transistor has an unstressed channel and each pull-down transistors has a stressed channel.

2. The integrated circuit of claim 1 wherein the ion ratio between the at least one pass-gate transistor and the at least one pull-down transistor is about 1 or greater.

3. The integrated circuit of claim 1 further comprising a logic area adjacent to an area including said at least one static random access memory cell wherein said logic area includes at least one nFET having a stressed channel and at least one pFET having an unstressed channel.

4. An integrated circuit comprising:
    a first area containing at least one SRAM cell, wherein said at least one SRAM cell includes at least one pass-gate transistor and at least one pull-down transistor, wherein each pass-gate transistor has an unstressed channel and each pull-down transistor has a stressed channel; and
    a second area containing at least one nFET having a stressed channel and at least one pFET having an unstressed channel.

5. The integrated circuit of claim 4 wherein the ion ratio between the at least one pass-gate transistor and the at least one pull-down transistor is about 1 or greater.

* * * * *